US011429770B1

(12) United States Patent
Dua et al.

(10) Patent No.: US 11,429,770 B1
(45) Date of Patent: Aug. 30, 2022

(54) SYSTEM, METHOD, AND COMPUTER PROGRAM PRODUCT FOR ANALYZING X-PROPAGATION SIMULATIONS

(71) Applicant: Cadence Design Systems, Inc., San Jose, CA (US)

(72) Inventors: Amit Dua, Fremont, CA (US); Amit Aggarwal, Ghaziabad (IN); Manu Chopra, New Delhi (IN); Hemant Gupta, Delhi (IN); Amit Sharma, Noida Uttar Predesh (IN); Abhishek Raheja, Frement, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 273 days.

(21) Appl. No.: 16/869,820

(22) Filed: May 8, 2020

(51) Int. Cl.
*G06F 30/3308* (2020.01)

(52) U.S. Cl.
CPC ................ *G06F 30/3308* (2020.01)

(58) Field of Classification Search
CPC .................................. G06F 30/3308
See application file for complete search history.

*Primary Examiner* — Jack Chiang
*Assistant Examiner* — Aric Lin
(74) *Attorney, Agent, or Firm* — Mark H. Whittenberger, Esq.; Holland & Knight LLP

(57) ABSTRACT

The present disclosure relates to a computer-implemented method for electronic design verification. Embodiments may include receiving an electronic design at a verification environment. Embodiments may also include performing a simulation of a portion of the electronic design in an X-propagation mode. Embodiments may further include determining whether the simulation is entering an element during a time range and determining whether a clock/reset associated with the element has an active X-edge. If the clock/reset has an active X-edge, embodiments may include preventing a recordation of coverage metrics during the time range.

20 Claims, 14 Drawing Sheets

200

receiving, using a processor, an electronic design at a verification environment

202

performing, using the processor, a simulation of a portion of the electronic design

204

determining, using the processor, whether the simulation is entering an element during a time range

206

determining whether a clock/reset associated with the element has an active x-edge

208

if the clock/reset has an active X-edge, preventing a recordation of coverage metrics during the time range

```
11  always @(posedge clk)
12○ if(en && chip_sel)
13○   q <= d & addr[1] & ctrl;
14  else
15○   q <= d | ctrl;
```

```
11  always @(posedge clk)
12⊗ if(en && chip_sel)
13⊗   q <= d & addr[1] & ctrl;
14  else
15⊗   q <= d | ctrl;
```

FIG. 13

SYSTEM, METHOD, AND COMPUTER PROGRAM PRODUCT FOR ANALYZING X-PROPAGATION SIMULATIONS

FIELD OF THE INVENTION

The present disclosure relates to electronic design verification, and more specifically, to a method for using X-propagation analysis associated with electronic design verification.

DISCUSSION OF THE RELATED ART

In the electronic design automation ("EDA") field, an X-bug or X value generally corresponds to a don't care value, an unknown value, or a wildcard value. For example, in the simulation of an electronic design, the standard hardware description language ("HDL") simulation semantics conceal X-bugs as they may not propagate X values in certain scenarios. This may happen due to X-optimism, which yields fewer unknown values resulting in hidden X-bugs. These bugs are generally uncovered during Gate Level Simulation which is too slow for modern System-on-a-chip ("SoCs"), and catching X-bugs at the Gate Level may involve added cost as it comes late in the cycle and results in further register transfer level ("RTL") iterations to fix the X-bugs. Any undriven net in a design is a potential X.

Low Power Designs are a major source of X's during simulation when power is being turned off or restored in some of the blocks. For example, in a low power design when a domain is powered off, it must be isolated from the rest of the system. This is achieved by using isolation logic which drives some valid values to powered on and active domains that were driven by the powered off domain. In the absence of isolation logic or due to bugs in isolation logic, X's from the powered off domain may get driven into the powered on domain resulting in corruption of logic in the active domains. The same problem may occur when power is being restored in a domain, the isolation logic needs to be removed but not before the power is completely restored and the domain starts driving correct values as per the logic inside the domain. Bugs in this sequence may again push X's to the connected domains.

SUMMARY OF DISCLOSURE

In one or more embodiments of the present disclosure, a computer-implemented method for electronic design verification is provided. The method may include receiving an electronic design at a verification environment. The method may also include performing a simulation of a portion of the electronic design. The method may further include determining whether the simulation is entering an element during a time range and determining whether a clock/reset associated with the element has an active X-edge. If the clock/reset has an active X-edge, the method may include preventing a recordation of coverage metrics during the time range.

One or more of the following features may be included. In some embodiments, the method may further include determining if X-propagation is currently occurring in a sub-block of the simulation. If X-propagation is currently occurring, the method may include preventing recordation of the sub-block. The method may also include recording coverage of one or more additional sub-blocks. If X-propagation is not currently occurring, the method may include allowing a recording of the sub-block. The element may be one or more of a sequential element or a combinational element.

In one or more embodiments of the present disclosure a computer-readable storage medium having stored thereon instructions, which when executed by a processor result in one or more operations is provided. Operations may include performing, using a processor, a simulation of a portion of an electronic design in an X-propagation mode, wherein the portion is written in one or more of Very High Speed Integrated Circuit Hardware Description Language ("VHDL") or SystemVerilog. Operations may further include determining, using the processor, whether the simulation is entering an element during a time range and determining whether a clock/reset associated with the element has an active X-edge. If the clock/reset has an active X-edge, operations may include preventing a recordation of coverage metrics during the time range.

One or more of the following features may be included. In some embodiments, the method may further include determining if X-propagation is currently occurring in a sub-block of the simulation. If X-propagation is currently occurring, operations may include preventing recordation of the sub-block. Operations may also include recording coverage of one or more additional sub-blocks. If X-propagation is not currently occurring, operations may include allowing a recording of the sub-block. The element may be one or more of a sequential element or a combinational element.

In one or more embodiments of the present disclosure, a system for electronic design verification is provided. The system may include one or more processors configured to perform a simulation of a portion of an electronic design in an X-propagation mode. The at least one processor may be further configured to determine, using the processor, whether the simulation is entering a sequential circuit during a time range. The at least one processor may be further configured to determine whether a clock/reset associated with the sequential circuit has an active X-edge, if the clock/reset has an active X-edge, preventing a recordation of coverage metrics during the time range.

One or more of the following features may be included. In some embodiments, the at least one processor may be configured to determine if X-propagation is currently occurring in a sub-block of the simulation. If X-propagation is currently occurring, the at least one processor may prevent recordation of the sub-block. The at least one processor may record coverage of one or more additional sub-blocks. If X-propagation is not currently occurring, the at least one processor may allow a recording of the sub-block. The portion of the electronic design may be written in at least one of Very High Speed Integrated Circuit Hardware Description Language ("VHDL") or SystemVerilog.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 2 is a flowchart depicting operations consistent with the verification process in accordance with an embodiment of the present disclosure;

FIG. 7 is a graphical user interface in accordance with an embodiment the present disclosure;

FIG. 8 is a graphical user interface in accordance with an embodiment the present disclosure;

FIG. 12 is a graphical user interface in accordance with an embodiment the present disclosure;

FIG. 13 is an example coverage report in accordance with an embodiment the present disclosure.

DETAILED DESCRIPTION

Figure 1:
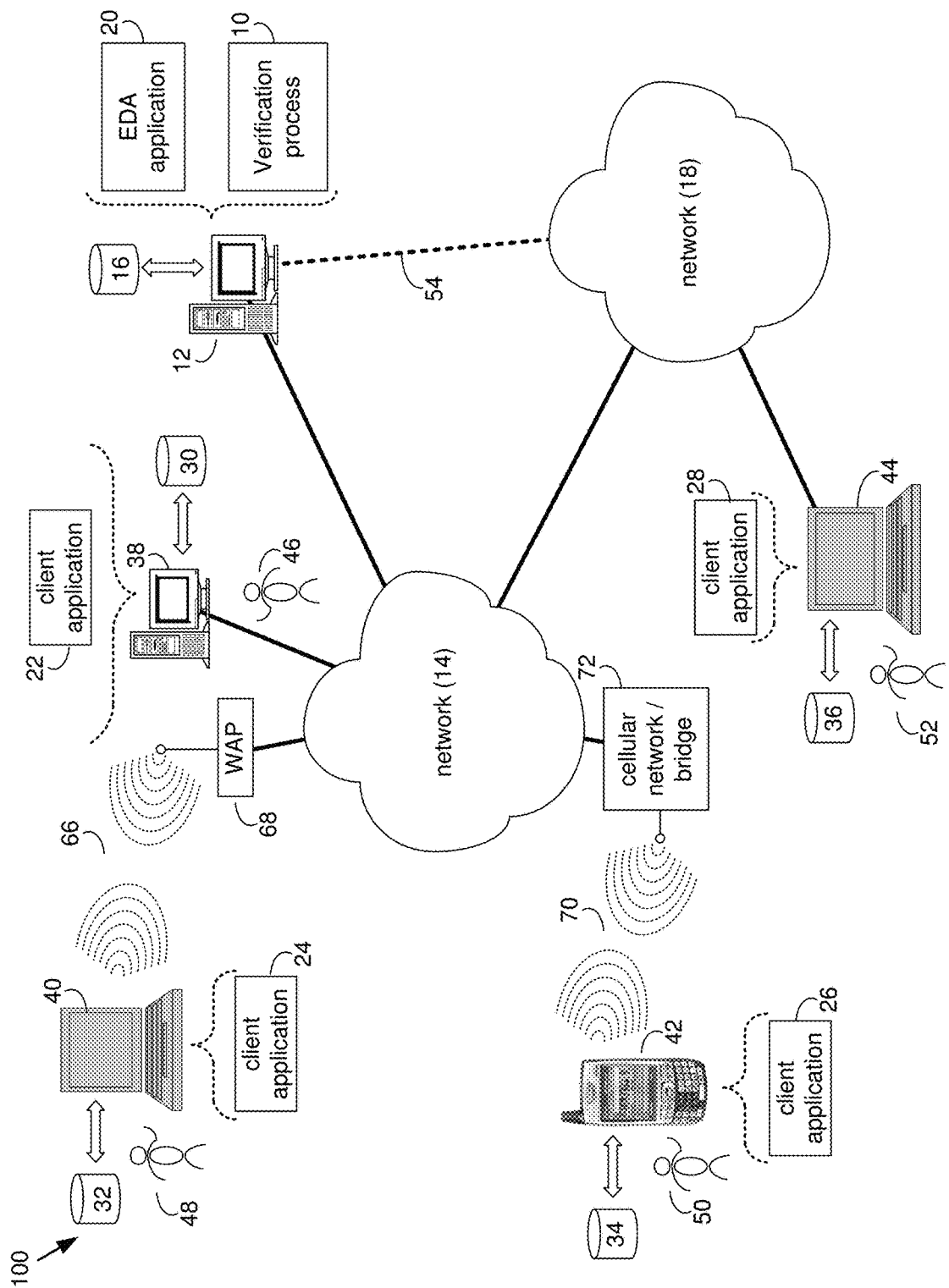
FIG. 1 is a diagram depicting an embodiment of a system in accordance with the present disclosure.

As discussed above, the standard HDL simulation semantics conceal X-bugs as they do not propagate X values in certain scenarios. This happens due to X-optimism, which yields fewer unknown values resulting in hidden X-bugs. These bugs are generally uncovered during Gate Level Simulation which is too slow for modern SoCs and catching X-bugs at Gate Level involves added cost as it comes late in the cycle and results in further RTL iterations to fix the X-bugs. With X-propagation technology at RTL, such X issues can be easily caught with the speed and performance of RTL.

Users of electronic design applications are running more and more X-propagation simulations to depict the real hardware behavior at RTL level. To sign off RTL, customers write stimulus to attain their coverage goals and perform coverage sign off. Customers need accurate coverage numbers in X-propagation simulations in order to achieve coverage closure and sign off chips. Any deviation in reporting accurate coverage numbers could result in false positives and may lead to missing out on the verification of key aspects of a System on a Chip. X-propagation helps to resolve the X-optimism problem by running a simulation in a pessimistic manner but the traditional coverage mechanism is optimistic in nature and may yield incorrect numbers with Xs in simulation. Generally, an electronic design may include many X states before reset and even after reset sequence, many variables may still hold an X state. This implies that the traditional coverage mechanism may jeopardize the coverage collection mechanism significantly.

This problem may be a result of coverage and X-propagation being defined independently without consideration for the cross-product. The X-propagation methodology runs multiple branches of code to run the pessimistic or accurate simulation as per the X semantics. This may affect coverage results collected in traditional way.

Accordingly, embodiments of the present disclosure provide an innovative coverage solution that may operate in the presence of X's propagating that are not considered covered. Embodiments of the verification process described herein may define how accurate or pessimistic coverage should be scored in X-propagation simulations. There are no known tools available in the market which solve this optimistic coverage problem in X-propagation simulations. For coverage scoring, users currently need to rely on non-X-propagation simulations.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a verification process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, verification process 10 may reside on and be executed, in whole or in part, by a client electronic device, such as a personal computer, notebook computer, personal digital assistant, or the like.

The instruction sets and subroutines of verification process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Verification process 10 may be a stand alone application, or may be an applet/application/script that may interact with and/or be executed within EDA application 20. In addition/ as an alternative to being a server-side process, verification process 10 may be a client-side process (not shown) that may reside on a client electronic device (described below) and may interact with an EDA client application (e.g., one or more of EDA client applications 22, 24, 26, 28). Further, verification process 10 may be a hybrid server-side/client-side process that may interact with EDA application 20 and an EDA client application (e.g., one or more of client applications 22, 24, 26, 28). As such, verification process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize verification process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11 a, 802.11 b, 802.11 g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11 x specifications may use Ethernet protocol and carrier sense multiple access with collision avoidance (i.e., CSMA/CA) for path sharing. The various 802.11 x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Referring now to FIG. 2, an exemplary flowchart 200 depicting operations consistent with verification process 10 is provided. Operations may include receiving (202), using a processor, an electronic design at a verification environment and performing (204) a simulation of a portion of the electronic design. The method may further include determining (206) whether the simulation is entering an element during a time range and determining (208) whether a clock/reset associated with the element has an active X-edge. If the clock/reset has an active X-edge, the method may include preventing (210) a recordation of coverage metrics during the time range. Numerous additional operations are also within the scope of the present disclosure.

Embodiments of verification process 10 may be configured to enable faster debug and analysis of X propagation failures using formal verification. As discussed above, one of the key challenges in the verification of an ASIC/SoC is X (unknown) propagation debug. X propagation may occur due to many reasons, some of which may include, but are not limited to, uninitialized memory, timing violations, non-resettable flops, etc. X propagation bugs are very difficult to debug and may consume an enormous amount of time due to the presence of hundreds/thousands of non resettable flops and other X sources which may need to be traced separately for every X propagation.

Accordingly, any solution that can point to a unique X source that propagates to the target node (in a time efficient way) would reduce the X propagation failure analysis drastically. In this way, embodiments of verification process 10 may be configured to detect a unique X source for an X propagation failure using a formal verification technique. The analysis would introduce extra circuitry to the hardware design. In some embodiments, this extra circuitry may be configured to enable all X sources while keeping a single X source active non-deterministically. The formal verification analysis would then not only verify for X propagation but also generate relevant debug information from the analysis.

It should be noted that in existing technologies that are used to help debug X propagation failure are all post-processing solutions. The simulation or formal X propagation trace is loaded and multiple algorithms are applied to refine the trace to contain minimum X values. However, the primary issue with the current set of ideas is that the analysis is incomplete and based upon certain heuristics. So, the analysis may result in multiple X-sources still remaining in the trace or may select an incorrect X source. Moreover, the analysis is extremely time consuming. As for any realistic design, it may take days to finish the analysis.

As used herein, the term "proven" as it relates to X propagation may refer to a situation where no X source can propagate to this target node. The term "failed" may refer to a situation where an X source is able to propagate to the target node.

Figure 3:
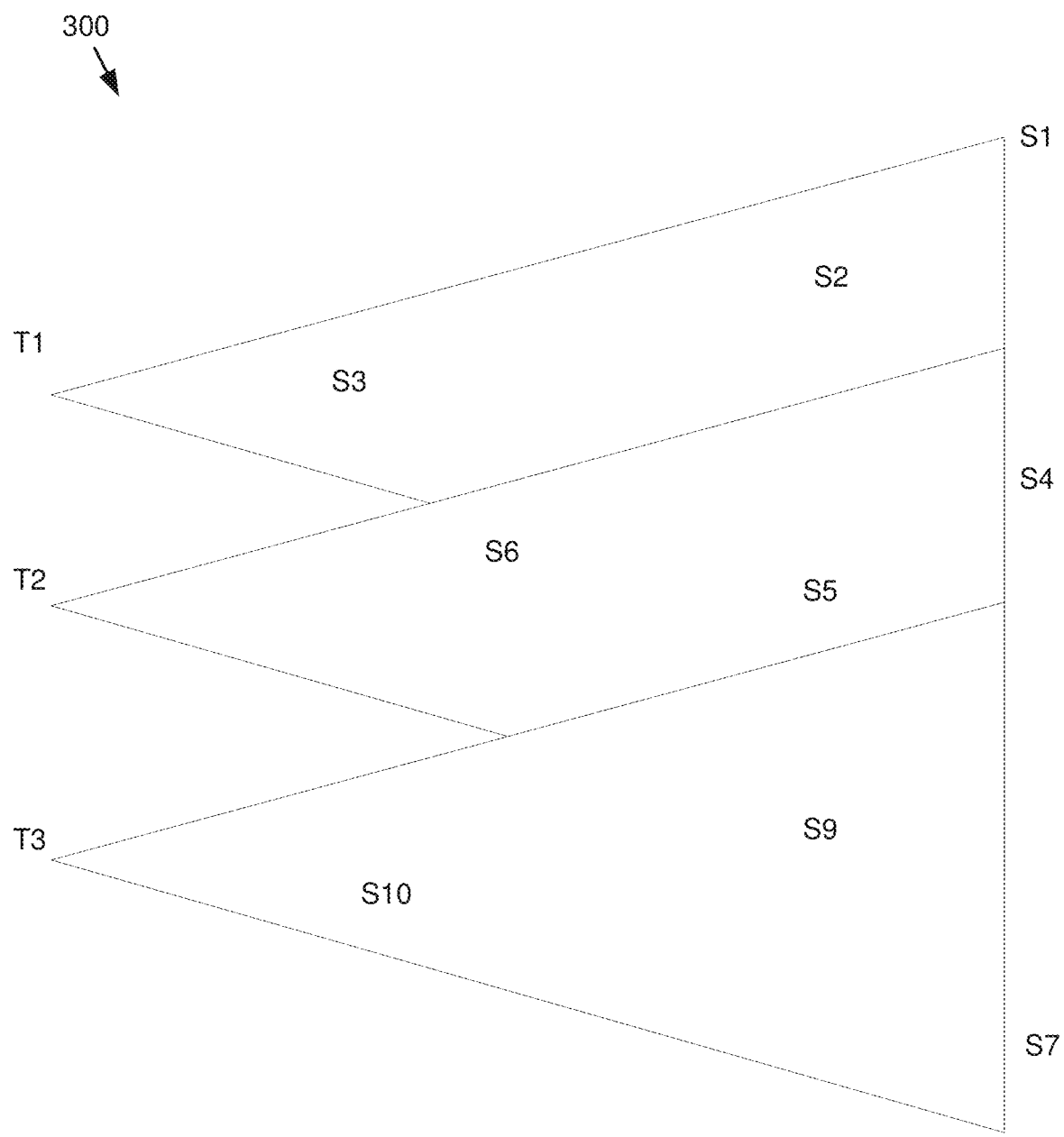
FIG. 3 is a diagram depicting an example of an X-propagation problem modeled for formal verification in accordance with the present disclosure.

Referring now to FIG. 3, an embodiment 300 depicting an example of an X-propagation problem modeled for formal verification in accordance with the present disclosure is provided. FIG. 3 shows the X propagation problem modeled for formal verification. A set of target nodes (e.g., T1 to T3) and a set of potential X source nodes (e.g., S1 to S10) may be identified.

Figure 4:
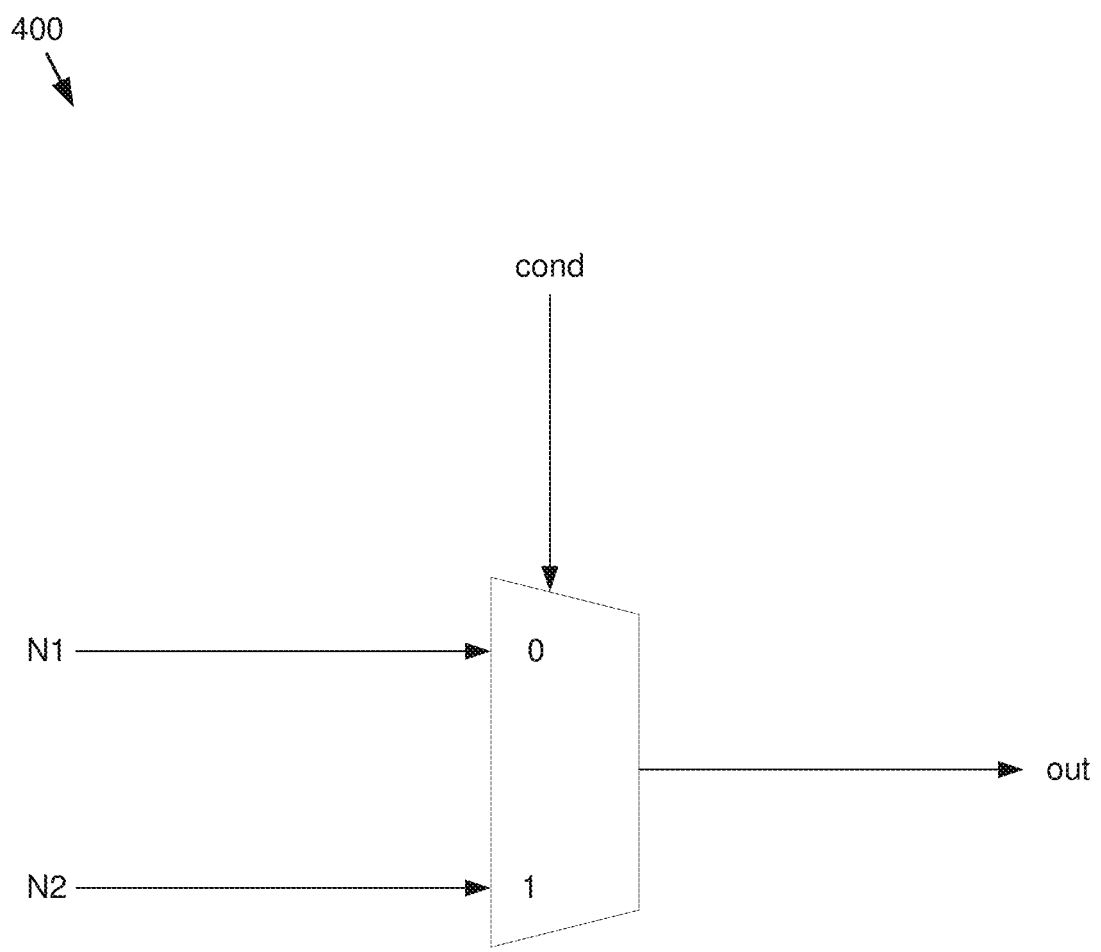
FIG. 4 is a diagram depicting an example of multiplexer logic in accordance with an embodiment the present disclosure.

FIG. 4 shows a diagram depicting an example of multiplexer logic in accordance with an embodiment the present disclosure. Here, it is shown that whenever there is an X failure at any target node, a single X source may always cause it keeping the other X sources as free inputs. FIG. 4 includes multiplexer logic where based upon a certain condition "cond" data, "N1" or" N2" would propagate to "out". Consider that "N2" data has an X value. However, if "cond" is always a constant value 0, the X would never propagate to the "out". Additionally and/or alternatively, if "cond" is 1 or X, the X value from N2 may propagate to the "out". If the X can reach at "cond" through some X source S1, value 1 may also reach at "cond" if the X source becomes a "free" input.

Figure 5:
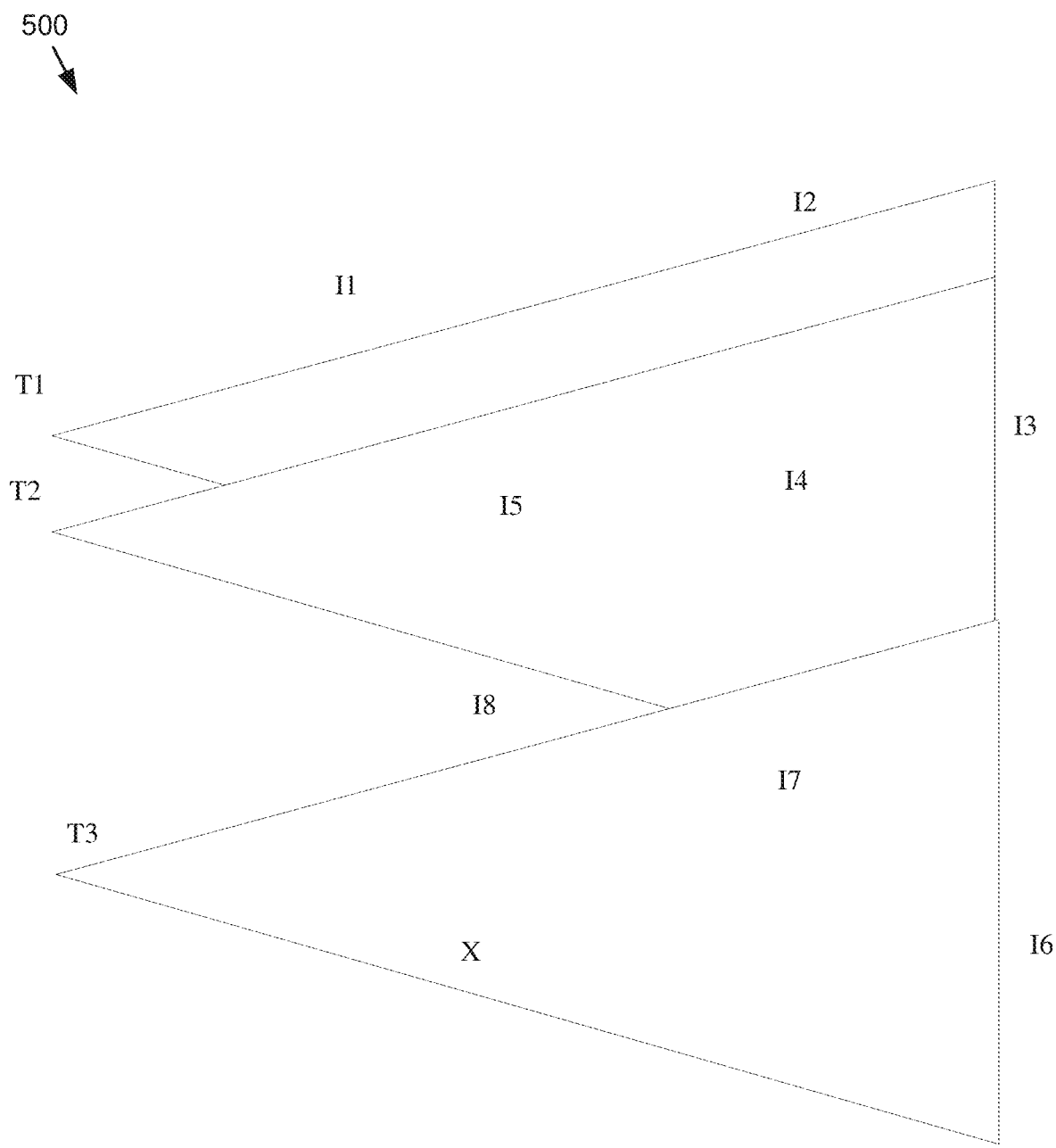
FIG. 5 is a diagram depicting an example of the difficulties in performing formal verification using the approach of FIG. 4.

FIG. 5 is a diagram depicting an example of the difficulties in performing formal verification using the approach of FIG. 4. As shown in the figure, one option may include considering each individual X source one by one leaving others as "free" inputs and performing formal verification analysis for a given target. However, considering thousands of X sources and a large number of target nodes, the analysis would be extremely expensive in time and would not be practical. As shown in the Figure, one of the inputs I1 . . . I9 is depicted as an X.

Figure 6:
FIG. 6 is a graphical user interface in accordance with an embodiment the present disclosure.
Figure 7:
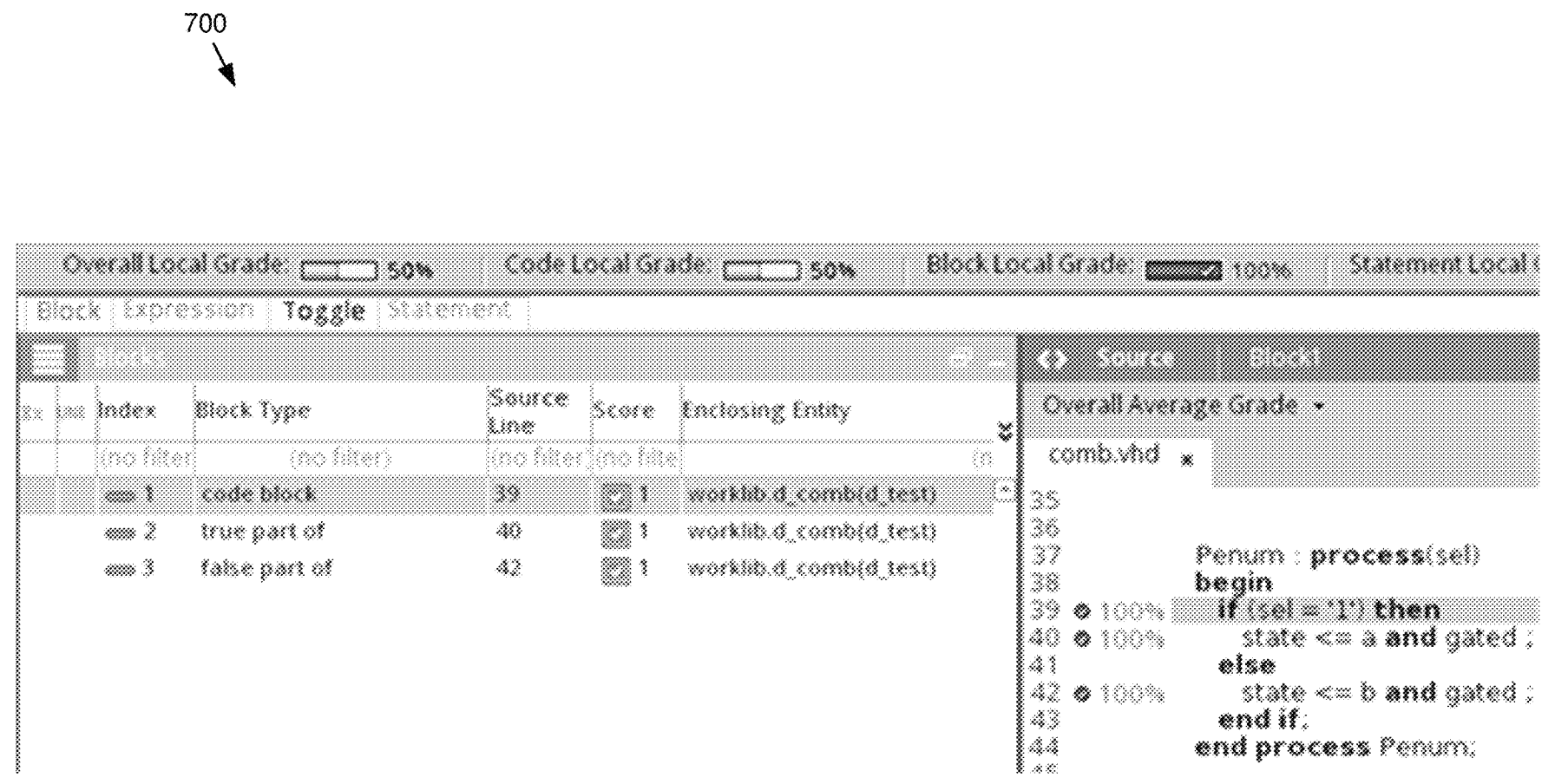

Referring now to FIGS. 6-14, embodiments of verification process 10 showing various RTL examples consistent with the teachings of the present disclosure are provided. FIG. 6 shows an example graphical user interface 600 in SystemVerilog and FIG. 7 shows an example graphical user interface 700 in Very High Speed Integrated Circuit Hardware Description Language ("VHDL").

In these two examples, when the "sel" expression goes to X, it indicates that expression may be either true or false and hence X-propagation simulation may execute both the true and false part and would merge the final value to "out" in FIG. 6 and "state" in FIG. 7. The terms "sel", "state", "out" etc may refer to registers or signals and an if-else block may refer to an action block inside an if-else language construct in the embodiments used herein.

Accordingly, the coverage tool (e.g. EDA application 20 in FIG. 1) shows that both if-else blocks have been covered. This may be a false result from a coverage point of view. In actual hardware, either of these two if-else branches would execute. In other words, the coverage numbers at RTL are optimistic and lose accuracy in an X-propagation mode.

Even normal simulations, without X-propagation, may yield optimistic coverage numbers. Non-X-propagation simulations would only run the "false" branch when "sel" is X thereby showing coverage results for false part. However, in real hardware, it may be possible that "sel" was "1" and hence the true branch would execute. The coverage number in normal simulation also lack accuracy.

Figure 8:
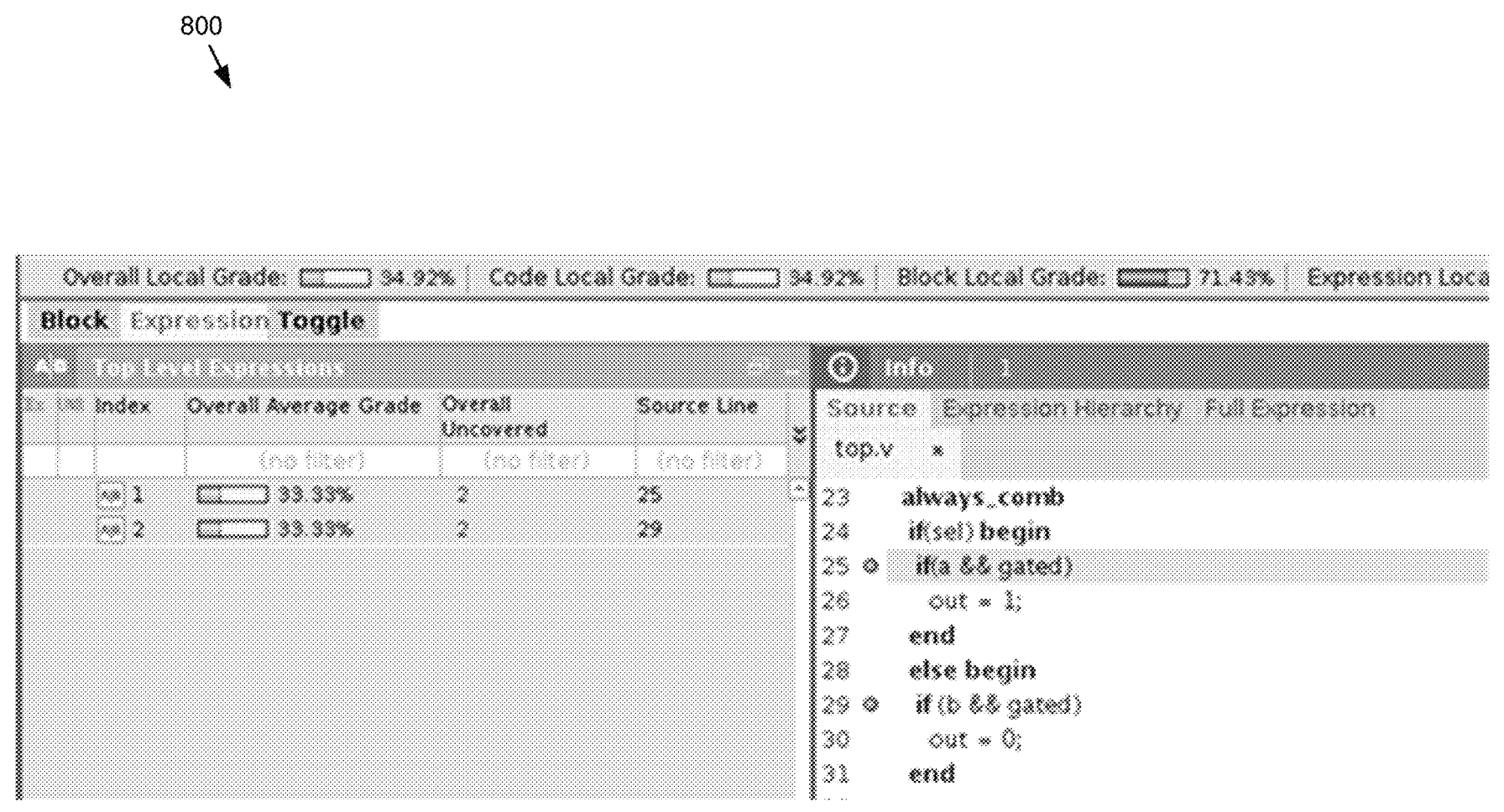

Referring now to FIG. 8 another example showing a graphical user interface 800 in SystemVerilog is provided. In this example, when select expression in parent "if" (i.e., line 24) is X, both "if and "else" branches may be executed. Expression coverage, for expressions on line 25 and line 29, may be recorded optimistically. This provides optimistic coverage results as in real hardware it may be possible that only first expression is evaluated to true and hence second "if" (line 29) may not be evaluated. As such, the coverage numbers in X-propagation simulations are optimistic and hence not accurate.

Figure 9:
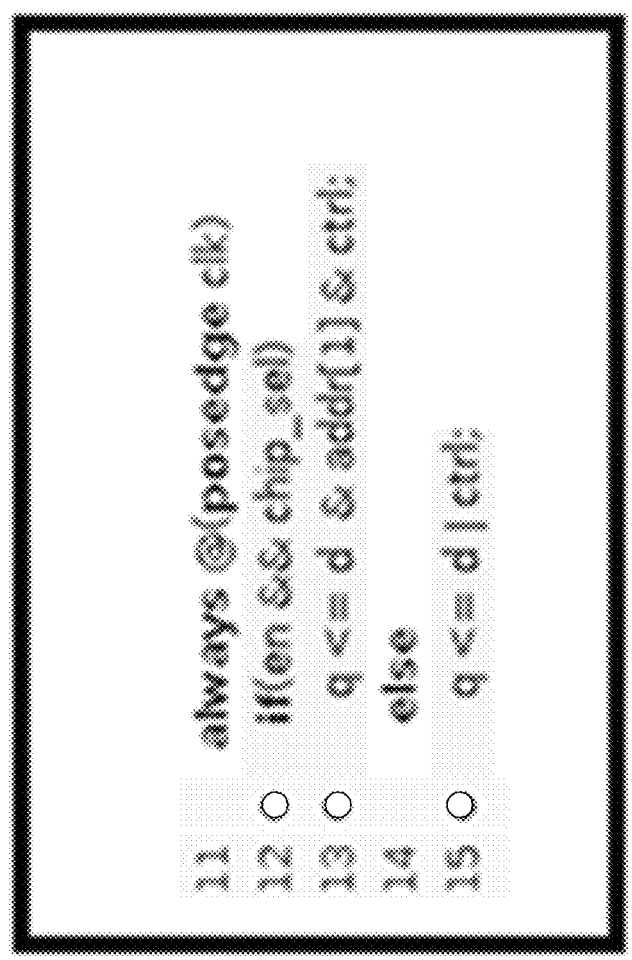
FIG. 9 is an example coverage report in accordance with an embodiment the present disclosure.

Referring now to FIG. 9 another SystemVerilog example showing a sequential circuit example is provided. In FIG. 9, when the "clk" variable goes from x->1, X-propagation will happen as it's an X edge on clk. Since this flop will execute, the current coverage solution will mark the "if" block and expressions covered for X transition on clk. Since this is an X edge on clk, in the real hardware either this flop will execute if X is 1 or the flop will not execute if X is 0. As such, coverage metrics are giving optimistic results in X-propagation mode.

Even normal simulations, without X-propagation, yield optimistic coverage numbers. In normal simulations, x->1 edge on clock may be treated as posedge and would execute the flop, thereby resulting in capturing of coverage metrics. As such, the coverage numbers in normal simulation also lack accuracy.

In operation, when a user is performing coverage closure, he/she will always want accurate results or pessimistic results. Optimistic coverage results may hide important gaps in verification and this can lead to silicon failure. This may also lead to coverage holes in overall verification sign off process. Accordingly, customers need a solution which removes optimism in coverage results and gives them accurate coverage results in X-propagation simulations.

In some embodiments, verification process 10 may enable cross-product interaction between X-propagation and coverage. Accordingly, verification process 10 may not record coverage while X's are propagating and may enable coverage when deterministic values are propagating. When deterministic values are simulated in simulation, the solution may continue to record the coverage metrics. For the value-based coverages, counts should be incremented based on the final value transitions.

Accordingly, embodiments of verification process 10 may have coverage metrics available for deterministic values and non-determinism has been removed from the coverage results. This applies to both combinatorial and sequential elements by being able to detect level X's and X related events (even if all levels are deterministic after the event). Embodiments of verification process 10 may resolve the problem for both SystemVerilog and VHDL languages.

Coverage results should never be optimistic in nature. Optimistic results shown by coverage may leave holes in the user verification plan. Embodiments of the present disclosure are configured to address this problem.

Figure 10:
FIG. 10 is an example coverage report in accordance with an embodiment the present disclosure.

Referring now to FIG. 10, a graphical user interface 1000 showing an example user design problem for combinational elements is provided. Using existing approaches, in FIG. 10, the coverage report will show inaccurate results in an X-propagation simulation. In this example, the Always block (extreme left) will execute and it will show coverage for all the possible blocks (e.g., s1, s2, s3, s4) since the "state" variable is X. This is an optimistic result since the input stimulus is not intended to cover all four possible states in real hardware. In contrast, using the teachings of the present disclosure, verification process 10 in conjunction with EDA application 20 may address this problem by not recording the coverage for this block when X-propagation is occurring at any time during the simulation. This implies when a "state" is unknown, and this always block executes, verification process 10 will not record coverage as X-propagation is actively happening at this time (refer to the results at extreme right in FIG. 10). Thus, embodiments of verification process 10 help to address the problem of reporting incorrect or optimistic coverage numbers with X-propagation for combinational elements.

Figure 11:
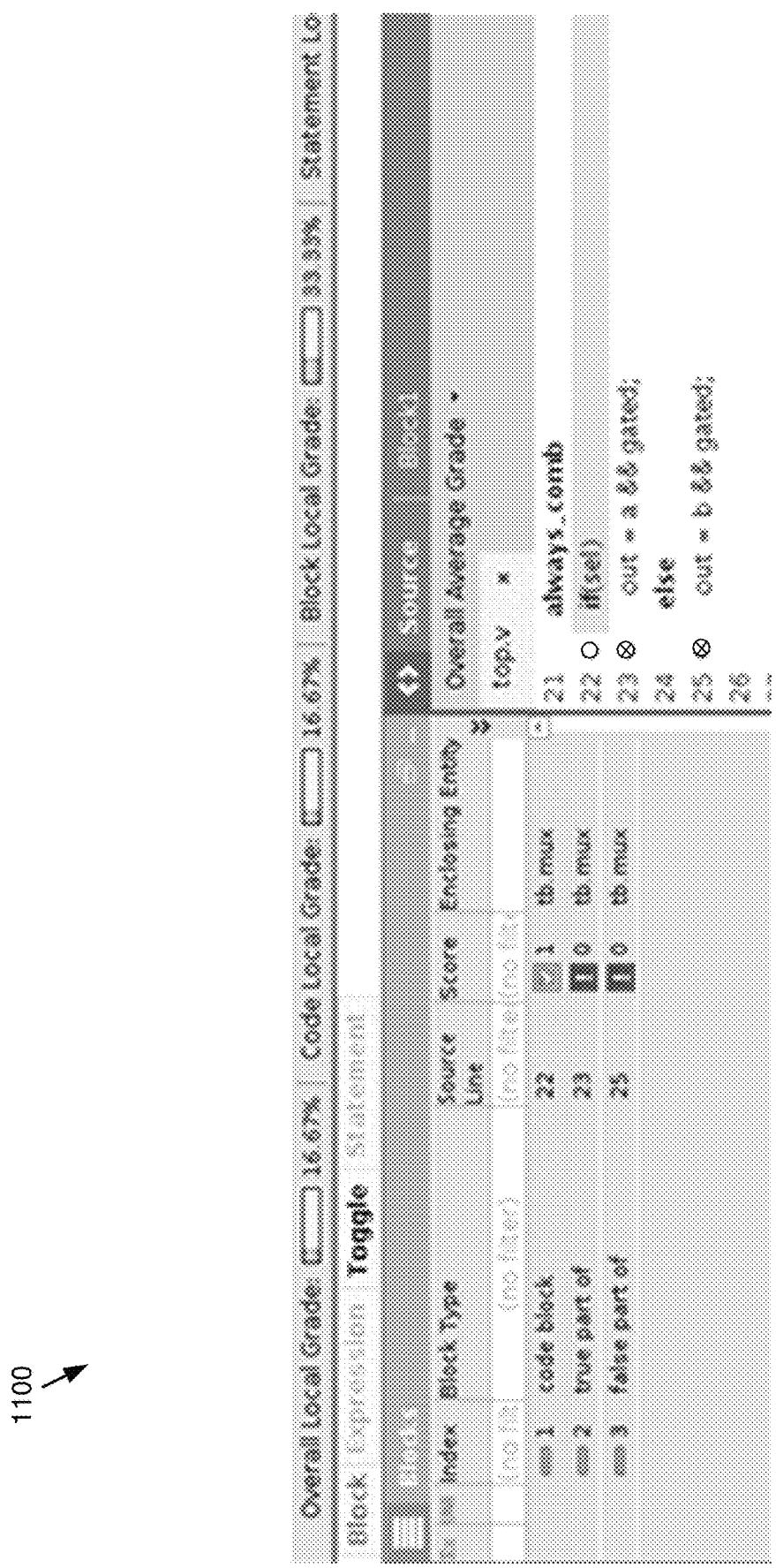
FIG. 11 is a graphical user interface in accordance with an embodiment the present disclosure.
Figure 12:
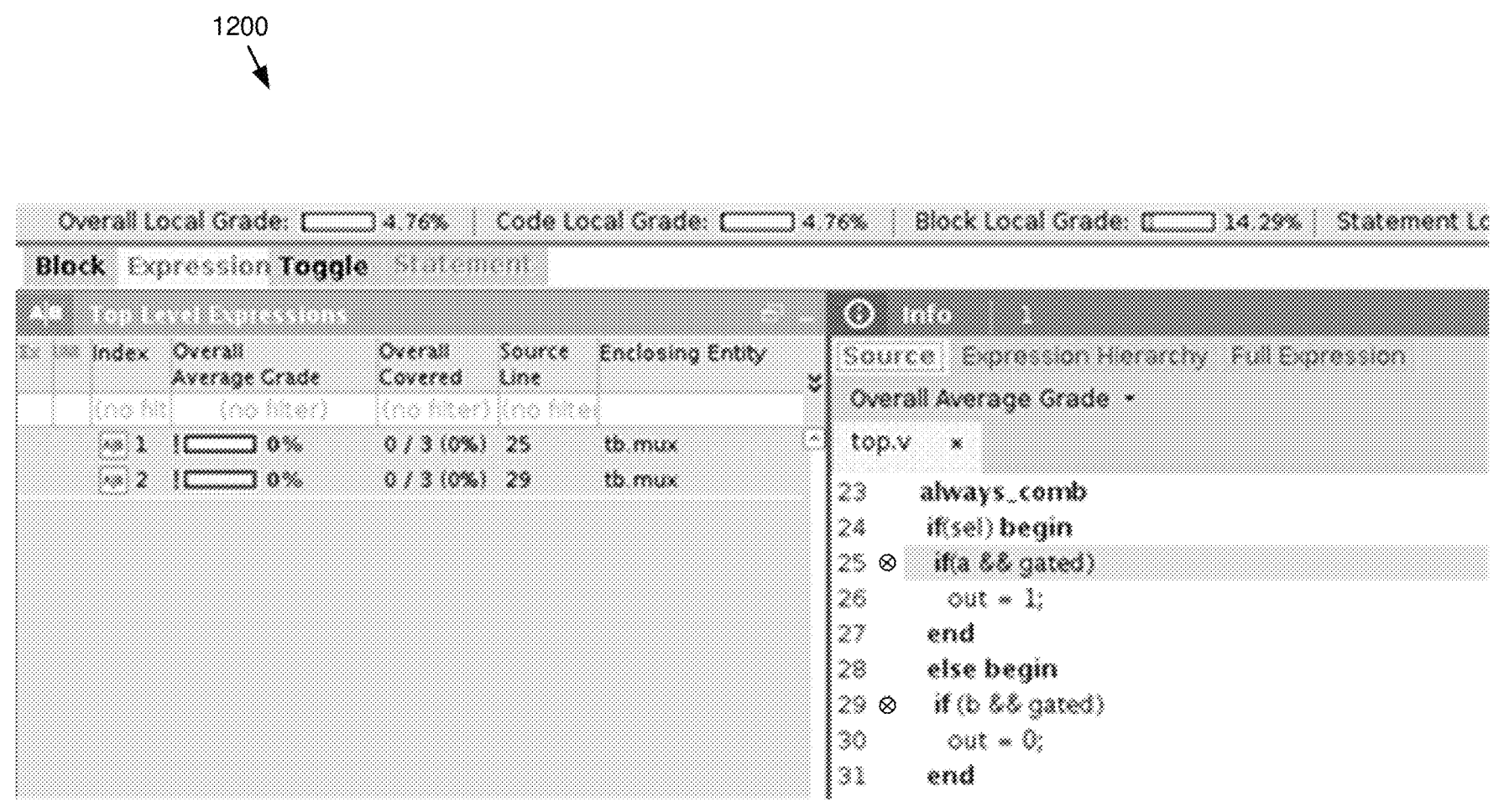

FIG. 11 shows how the problem for FIG. 6 will be solved using verification process 10. Similarly the graphical user interface shown in FIG. 12 shows how the problem for FIG. 8 will be solved using verification process 10.

Referring now to FIG. 13, an example showing an actual user design problem for sequential elements. In this example the left portion of the figure shows the problem prior to using verification process 10 and the right portion shows the results after the innovation. FIG. 13 displays the example of FIG. 9 which was discussed above with the application of verification process 10. In this example, when the "clk" variable goes from x->1, X-coverage propagation will happen as it is an X edge on clk. Since this flop will execute, the current solution will mark the "if" block and expressions covered for X transition on clk. Since this is an X edge on clk, in the real hardware either this flop will execute if X is 1 or the flop will not execute if X is 0. As such, coverage metrics provide optimistic results here. Embodiments included herein address this problem and will not record coverage metrics at this point of time since X is an unknown value. At other times during the simulation, when the deterministic value is present on the "clk", coverage metrics will be recorded. Thus, embodiments of verification process 10 may help to address the problem of reporting incorrect or optimistic coverage numbers with X-propagation for sequential elements.

Figure 14:
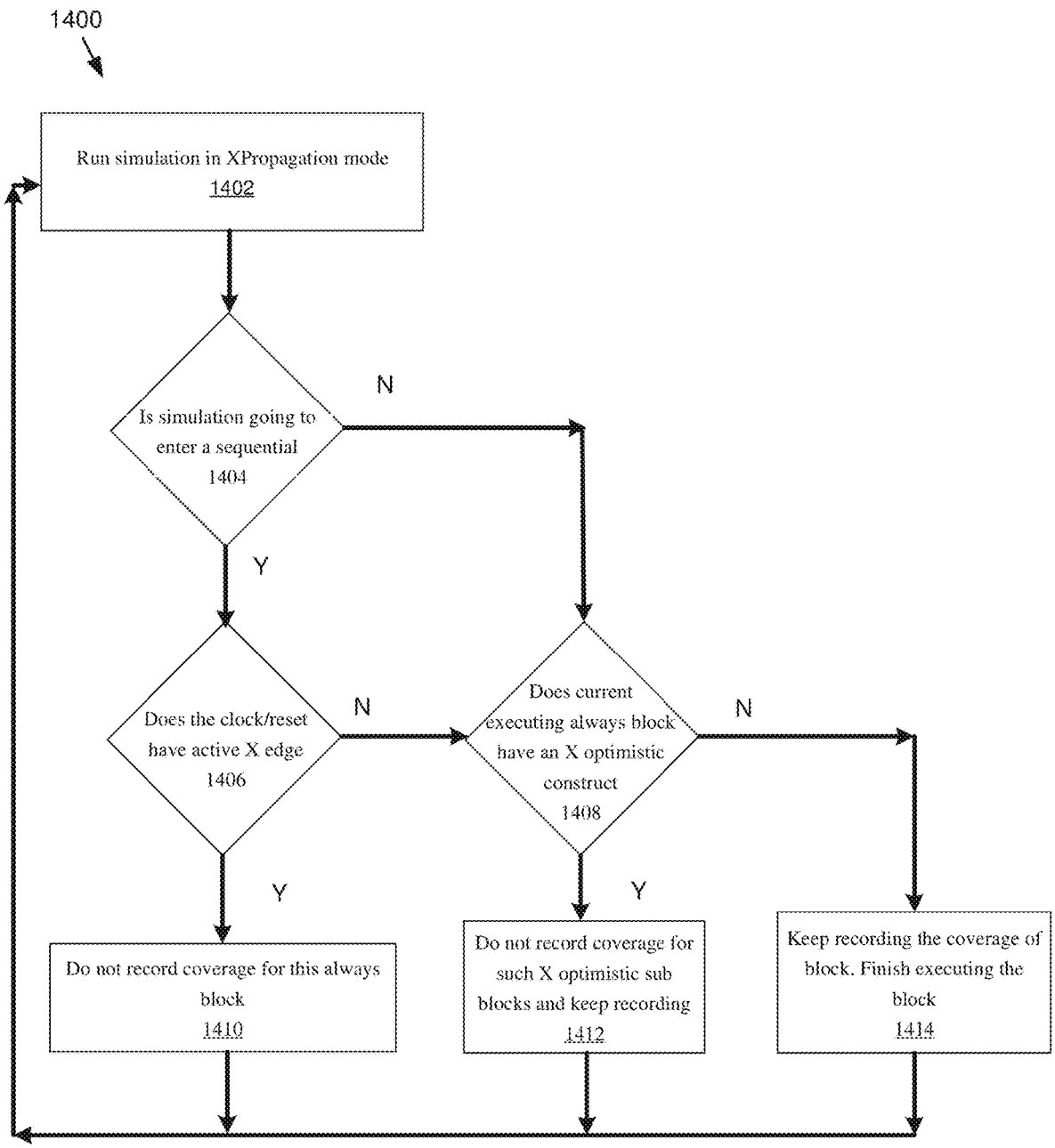
FIG. 14 is a flowchart depicting operations consistent with the verification process in accordance with an embodiment of the present disclosure.

Referring now to FIG. 14, a flowchart 1400 consistent with embodiments of verification process 10 is provided. In operation, the process may include running 1402 the simulation in an X-propagation mode. The process may determine 1404 whether or not the simulation is entering a sequential element. If it is entering a sequential element, the process may determine 1406 if the clock/reset has an active X edge and if so, the process may not record 1410 any coverage for this block. In contrast, if the simulation is not entering a sequential element the process may be configured to determine 1408 whether or not the sequential or combination block is currently undergoing X-propagation. If so, no coverage may be recorded 1412 for such X-optimistic sub-blocks. If not, the coverage of the block may be recorded 1414.

Embodiments of the present disclosure may provide numerous advantages over existing approaches. Accordingly, embodiments of the present disclosure may remove optimism from coverage results and help to identify gaps or holes in verification plans due to accurate coverage collection. Embodiments of verification process 10 require no change in RTL or the test bench. The process has no scalability issues even for modern SoCs and may allow for coverage collection in X propagation simulations alone without requiring non-X propagation simulations for coverage collection only.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
   receiving, using a processor, an electronic design at a verification environment;
   performing, using the processor, a simulation of a portion of the electronic design;
   determining, using the processor, whether the simulation is entering an element during a time range;
   determining whether a clock/reset associated with the element has an active X-edge; and
   if the clock/reset has an active X-edge, preventing a recordation of coverage metrics during the time range.

2. The computer-implemented method of claim 1, further comprising:
   determining if X-propagation is currently occurring in a sub-block of the simulation.

3. The computer-implemented method of claim 2, further comprising:
   if X-propagation is currently occurring, preventing recordation of the sub-block.

4. The computer-implemented method of claim 3, further comprising:
   recording coverage of one or more additional sub-blocks.

5. The computer-implemented method of claim 2, further comprising:
   if X-propagation is not currently occurring, allowing a recording of the sub-block.

6. The computer-implemented method of claim 1, wherein the element is a sequential element.

7. The computer-implemented method of claim 1, wherein the element is a combinational element.

8. A computer-readable storage medium for electronic design verification, the computer-readable storage medium having stored thereon instructions that when executed by a machine result in one or more operations, the operations comprising:
   performing, using a processor, a simulation of a portion of an electronic design in an X-propagation mode, wherein the portion is written in one or more of Very High Speed Integrated Circuit Hardware Description Language ("VHDL") or SystemVerilog;
   determining, using the processor, whether the simulation is entering an element during a time range;
   determining whether a clock/reset associated with the element has an active X-edge; and
   if the clock/reset has an active X-edge, preventing a recordation of coverage metrics during the time range.

9. The computer-readable storage medium of claim 8, further comprising:
   determining if X-propagation is currently occurring in a sub-block of the simulation.

10. The computer-readable storage medium of claim 9, further comprising:
    if X-propagation is currently occurring, preventing recordation of the sub-block.

11. The computer-readable storage medium of claim 10, further comprising:
    recording coverage of one or more additional sub-blocks.

12. The computer-readable storage medium of claim 9, further comprising:
    if X-propagation is not currently occurring, allowing a recording of the sub-block.

13. The computer-readable storage medium of claim 10, wherein the element is a sequential element.

14. The computer-readable storage medium of claim 8, wherein the element is a combinational element.

15. A system for electronic design verification comprising:
- a computing device having at least one processor configured to performing a simulation of a portion of an electronic design, the at least one processor further configured to determine, using the processor, whether the simulation is entering a sequential circuit during a time range, the at least one processor further configured to determine whether a clock/reset associated with the sequential circuit has an active X-edge, if the clock/reset has an active X-edge, preventing a recordation of coverage metrics during the time range.

16. The system of claim 15, further comprising:
- determining if X-propagation is currently occurring in a sub-block of the simulation.

17. The system of claim 16, further comprising:
- if X-propagation is currently occurring, preventing recordation of the sub-block.

18. The system of claim 17, further comprising:
- recording coverage of one or more additional sub-blocks.

19. The system of claim 16, further comprising:
- if X-propagation is not currently occurring, allowing a recording of the sub-block.

20. The system of claim 15, wherein the portion of the electronic design is written in at least one of Very High Speed Integrated Circuit Hardware Description Language ("VHDL") or SystemVerilog.

\* \* \* \* \*